United States Patent
Zhang

(10) Patent No.: US 10,978,678 B2
(45) Date of Patent: Apr. 13, 2021

(54) DISPLAY PANEL AND DISPLAY PANEL MANUFACTURING METHOD

(71) Applicant: Wuhan China Star Optoelectronics Semiconductor Display Technology Co., Ltd., Wuhan (CN)

(72) Inventor: Wenzhi Zhang, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 160 days.

(21) Appl. No.: 16/317,549

(22) PCT Filed: Sep. 11, 2018

(86) PCT No.: PCT/CN2018/104927
§ 371 (c)(1),
(2) Date: Jan. 13, 2019

(87) PCT Pub. No.: WO2019/242114
PCT Pub. Date: Dec. 26, 2019

(65) Prior Publication Data
US 2020/0083490 A1 Mar. 12, 2020

(30) Foreign Application Priority Data
Jun. 21, 2018 (CN) .......................... 201810646399.9

(51) Int. Cl.
*H01L 51/56* (2006.01)
*H01L 51/52* (2006.01)

(52) U.S. Cl.
CPC .......... *H01L 51/56* (2013.01); *H01L 51/5275* (2013.01)

(58) Field of Classification Search
CPC ............................ H01L 51/56; H01L 51/5275
USPC ............................................................ 257/40
See application file for complete search history.

(56) References Cited

U.S. PATENT DOCUMENTS

2016/0093828 A1* 3/2016 Kim .................... H01L 51/5253
257/40

* cited by examiner

*Primary Examiner* — Elias Ullah

(57) ABSTRACT

A display panel and a display panel manufacturing method are provided. The display panel includes a thin film package layer; the thin film package layer includes at least one first inorganic layer, at least one first organic layer and at least one second inorganic layer. The first inorganic layer includes an inorganic material absorbing light of an ultraviolet wavelength band. Progressive decrease of a refractive index of the first inorganic layer prevents light emitted out of the OLEDs from sustaining total reflection in each contacting surface between layers and effectively increases stability and light performance of the display panel.

4 Claims, 5 Drawing Sheets

DISPLAY PANEL AND DISPLAY PANEL MANUFACTURING METHOD

RELATED APPLICATIONS

This application is a National Phase of PCT Patent Application No. PCT/CN2018/104927 having International filing date of Sep. 11, 2018, which claims the benefit of priority of Chinese Patent Application No. 201810646399.9 filed on Jun. 21, 2018. The contents of the above applications are all incorporated by reference as if fully set forth herein in their entirety.

FIELD AND BACKGROUND OF THE INVENTION

The present invention relates to display panel manufacturing fields, especially to a display panel and a display panel manufacturing method.

In flexible display fields, organic light-emitting diodes (OLEDs) have an overwhelming advantage. However, tendency of organic materials to be susceptible to water and oxygen erosion restricts the development of OLEDs.

Therefore, packaging OLED devices to be isolated from the external environment is critical to the stability of the OLED device. For flexible devices, the current popular packaging technology solution is encapsulating OLED devices through laminated organic/inorganic thin films.

In the prior art, when light enters the organic buffer layer from the inorganic barrier layer or enters the air from the inorganic barrier layer, it is affected by the total reflection and luminous efficiency is therefore reduced.

Therefore, there is a need for a display panel to solve the above problems.

SUMMARY OF THE INVENTION

The present invention provides a display panel and a display panel manufacturing method to solve a technical issue of total reflection occurring when a light emitted from a conventional organic light-emitting diode (OLED) is transmitted in a thin film package.

To solve the above technical issue, the present invention provides technical solutions as follows.

The present invention provides a display panel manufacturing method, comprising:

providing a substrate, and forming an organic light-emitting diode (OLED) layer on the substrate;

forming a first inorganic layer on the OLED layer, wherein the first inorganic layer covers the OLED layer, and a refractive index of the first inorganic layer gradually decreases along a direction from the substrate to the OLED layer;

forming at least one first organic layer on the first inorganic layer; and forming at least one second inorganic layer on the first organic layer, wherein the second inorganic layer covers the first organic layer.

In the manufacturing method of the present invention, the display panel comprises one first inorganic layer, and the refractive index of the one first inorganic layer gradually decreases along the direction from the substrate to the OLED layer.

In the manufacturing method of the present invention, the display panel comprises at least two first inorganic layers, and the refractive indexes of the at least two first inorganic layers decrease gradually along the direction from the substrate to the OLED layer.

In the manufacturing method of the present invention, the first inorganic layer is made up of at least two inorganic materials with different refractive indexes, the at least two inorganic materials comprise at least one inorganic matter configured to absorb light of an ultraviolet wavelength band.

In the manufacturing method of the present invention, a minimum of the refractive index of the first inorganic layer is equal to or less than a refractive index of the first organic layer.

The present invention also provides a display panel, wherein the display panel comprises a substrate, an organic light-emitting diode (OLED) layer disposed on the substrate, and a thin film package layer disposed on the substrate and the OLED layer and covering the OLED layer;

wherein the thin film package layer comprises at least one first inorganic layer, a first organic layer formed on the first inorganic layer, and a second inorganic layer formed on the first organic layer;

wherein the first inorganic layer covers the OLED layer, and a refractive index of the first inorganic layer gradually decreases along a direction from the substrate to the OLED layer, wherein the first inorganic layer is made up of at least two inorganic materials with different refractive indexes, and the at least two inorganic materials comprises at least one inorganic matter configured to absorb light of an ultraviolet wavelength band.

In the display panel of the present invention, the display panel comprises one first inorganic layer, and the refractive index of the one first inorganic layer gradually decreases along the direction from the substrate to the OLED layer.

In the display panel of the present invention, the display panel comprises at least two first inorganic layers, and the refractive indexes of the at least two first inorganic layers decrease gradually along the direction from the substrate to the OLED layer.

In the display panel of the present invention, a minimum of the refractive index of the first inorganic layer is equal to or less than a refractive index of the first organic layer.

The present invention also provides a display panel that comprises: a substrate; an organic light-emitting diode (OLED) layer disposed on the substrate; and a thin film package layer disposed on the substrate and the OLED layer and covering the OLED layer;

wherein the thin film package layer comprises at least one first inorganic layer, a first organic layer formed on the at least one first inorganic layer, and a second inorganic layer formed on the first organic layer, wherein the at least one first inorganic layer covers the OLED layer, and a refractive index of the at least one first inorganic layer gradually decreases along a direction from the substrate to the OLED layer.

In the display panel of the present invention, the display panel comprises one first inorganic layer, and the refractive index of the one first inorganic layer gradually decreases along the direction from the substrate to the OLED layer.

In the display panel of the present invention, the display panel comprises at least two first inorganic layers, and the refractive indexes of the at least two first inorganic layers decrease gradually along the direction from the substrate to the OLED layer.

In the display panel of the present invention, a minimum of the refractive index of the first inorganic layer is equal to or less than a refractive index of the first organic layer.

Advantages: The present invention, by forming at least one first inorganic layer on the OLED layer with the first inorganic layer including the inorganic material absorbing light of an ultraviolet wavelength band, can protect human eyes and mitigate photo aging of the OLED devices. Progressive decrease of the refractive index of the first inorganic layer prevents light emitted out of the OLEDs from sustaining total reflection in each contacting surface between layers and effectively increases stability and light performance of the display panel.

BRIEF DESCRIPTION OF THE SEVERAL VIEWS OF THE DRAWINGS

To more clearly elaborate on the technical solutions of embodiments of the present invention or prior art, appended figures necessary for describing the embodiments of the present invention or prior art will be briefly introduced as follows. Apparently, the following appended figures are merely some embodiments of the present invention. A person of ordinary skill in the art may acquire other figures according to the appended figures without any creative effort.

DESCRIPTION OF SPECIFIC EMBODIMENTS OF THE INVENTION

Figure 1:
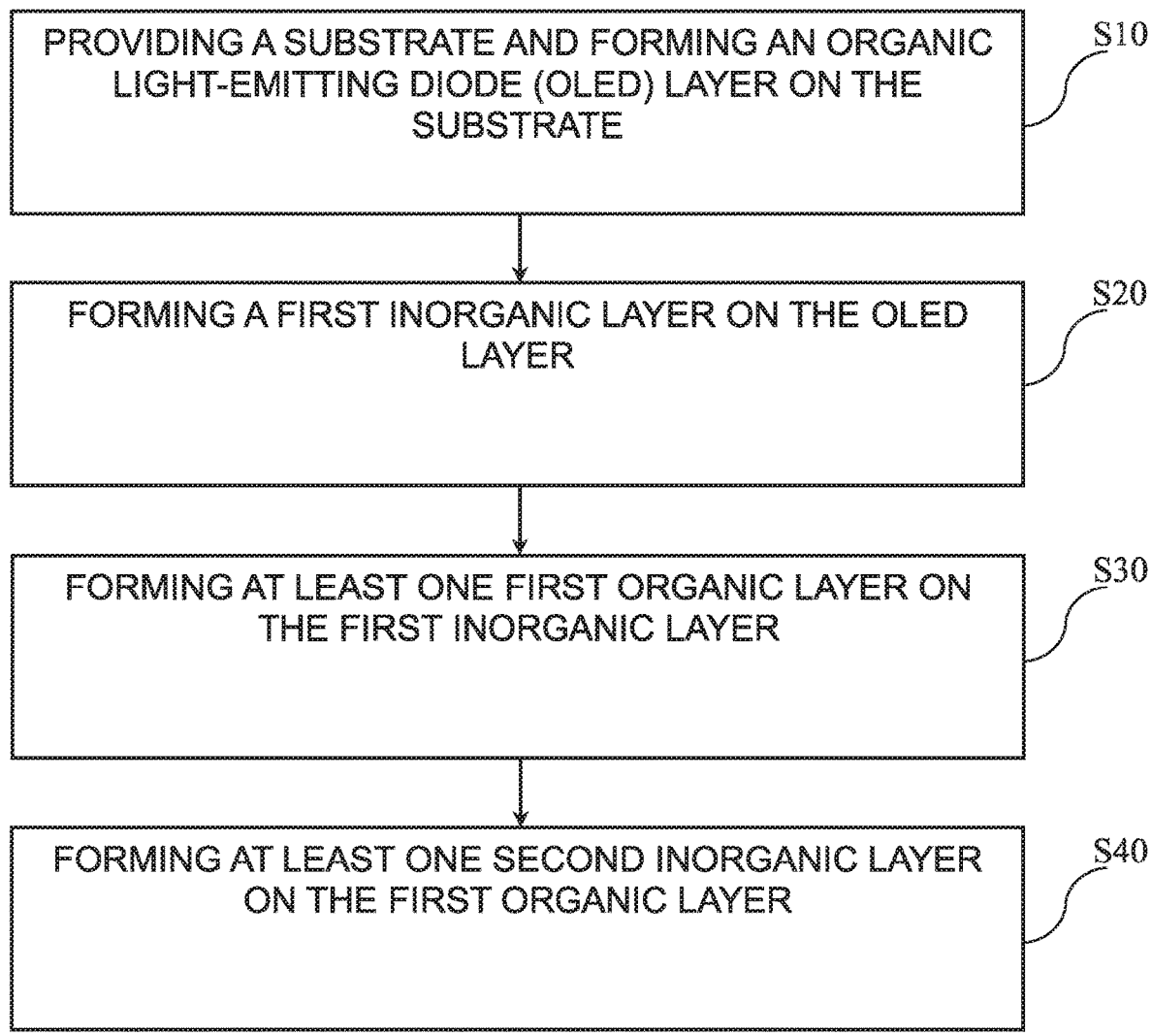
FIG. 1 is a schematic flowchart of a display panel manufacturing method of the present invention.

Each of the following embodiments is described with appending figures to illustrate specific embodiments of the present invention that are applicable. The terminologies of direction mentioned in the present invention, such as "upper", "lower", "front", "rear", "left", "right", "inner", "outer", "side surface" and etc., only refer to the directions of the appended figures. Therefore, the terminologies of direction are used for explanation and comprehension of the present invention, instead of limiting the present invention. In the figures, units with similar structures are marked with the same reference numerals.

With reference to FIG. 1, FIG. 1 is a schematic flowchart of a display panel manufacturing method of the present invention. The method includes steps as follows.

Step S10 comprises providing a substrate and forming an organic light-emitting diode (OLED) layer on the substrate.

With reference to FIGS. 2A-2E, FIGS. 2A-2E are schematic views of the display panel manufacturing method of the present invention corresponding to steps of the flowchart.

Figure 2A:
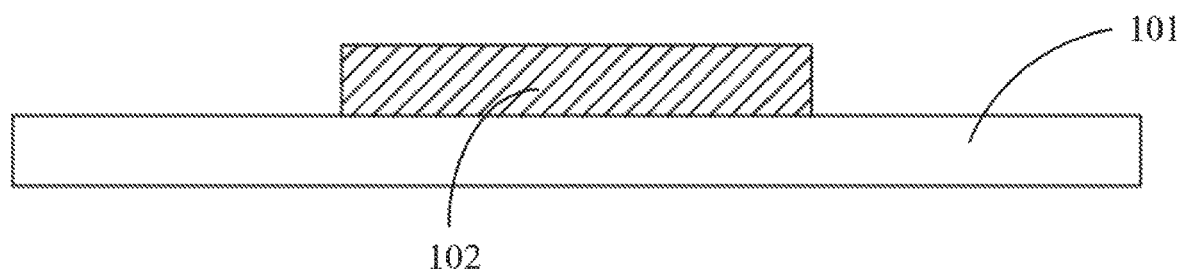
FIGS. 2A, 2B, 2C, 2D and 2E are schematic views of the display panel manufacturing method of the present invention corresponding to steps of the flowchart.

With reference to FIG. 2A, a substrate 101 is provided. The substrate 101 can be a flexible substrate. A material of the flexible substrate can be a polyimine film serving as a base of a flexible display panel.

An OLED layer 102 is formed on the substrate 101. The OLED layer 102 includes an anode layer, a pixel definition layer, a first common layer, a light-emitting layer, a second common layer, and a cathode layer.

Step S20 comprises forming a first inorganic layer on the OLED layer.

In the present step, the first inorganic layer covers the OLED layer, and a refractive index of the first inorganic layer gradually decreases along a direction from the substrate to the OLED layer.

In an embodiment, at least one first inorganic layer 103 is formed on the OLED layer 102 and the substrate 101 by a process such as a pulsed laser deposition (PLD) method, an atomic layer deposition (ALD) method or a sputtering method. The first inorganic layer 103 is also called inorganic improvement layer.

The first inorganic layer 103 is mainly made up of at least two composite materials with different refractive indexes, and proportions of the composite materials are controlled to form the first inorganic layer 103. In an embodiment, the first inorganic layer 103 is made up of two composite material, which will be described with the following example.

1. When a first composite material is a low refractive index material, the first composite material includes but is not limited to silicon dioxide or zinc oxide. A preferred range of a refractive index of the first composite material is 1.40-1.65. A proportion of the first composite material in the first inorganic layer 103 is 50-100%.

A second composite material is a high refractive index material. The second composite material includes but is not limited to titanium dioxide and zirconium dioxide. In an embodiment, second composite material refractive index can be 1.80-2.40. A proportion of the second composite material in the first inorganic layer 103 is 0-50%.

Figure 2B:
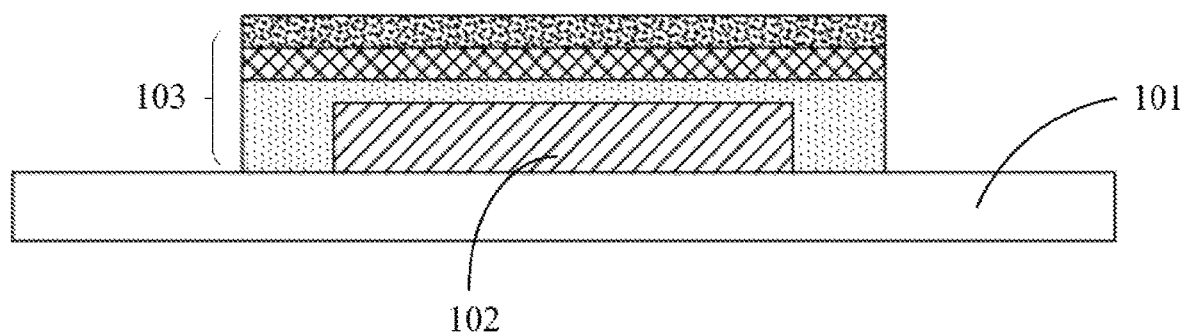

With reference to FIG. 2B, three layers of the first inorganic layer are formed on the OLED layer 102. A thickness of each film layer is 50-500 nm, and proportions of doping materials in each layer of the first inorganic layer are constants.

Along a direction from the substrate 101 to the OLED layer 102, doping proportions of the second composite materials gradually decrease. In other words, along the direction, refractive indexes of the first inorganic layers gradually decrease. A difference value between adjacent two of the first inorganic layers is 0.1-0.2. The refractive index of an upmost one of the first inorganic layers is similar or equal to a refractive index of another thin film package layer disposed on the upmost first inorganic layer to prevent total reflection due to light of the OLEDs transmitted among the film layers.

2. When the first composite material is a high refractive index material, the first composite material includes but is not limited to aluminum oxide or zirconium dioxide. In an embodiment, first composite material refractive index can be 1.75-2.25. A proportion of the first composite material in the first inorganic layer 103 is 50-100%.

The second composite material is a low refractive index material. The second composite material includes but is not limited to silicon dioxide. In an embodiment, the refractive index of the second composite material can be 1.40-1.55, and a proportion of the second composite material in the first inorganic layer 103 is 0-50%.

In the three first inorganic layers formed on the OLED layer 102, a thickness of each first inorganic layer is 50-500 nm. A proportion of the doping material in each first inorganic layer is constant.

Along the direction from the substrate 101 to the OLED layer 102, doping proportions of the second composite materials in the first inorganic layers gradually increase. In other words, along the direction from the substrate 101 to the OLED layer 102, the refractive indexes of the first inorganic layers gradually decrease. A difference value of the refractive indexes of adjacent two of the first inorganic layers is 0.1-0.2.

In an embodiment, the refractive index of an upmost one of the first inorganic layers is similar or equal to a refractive index of another thin film package layer disposed on the upmost first inorganic layer.

Figure 2C:
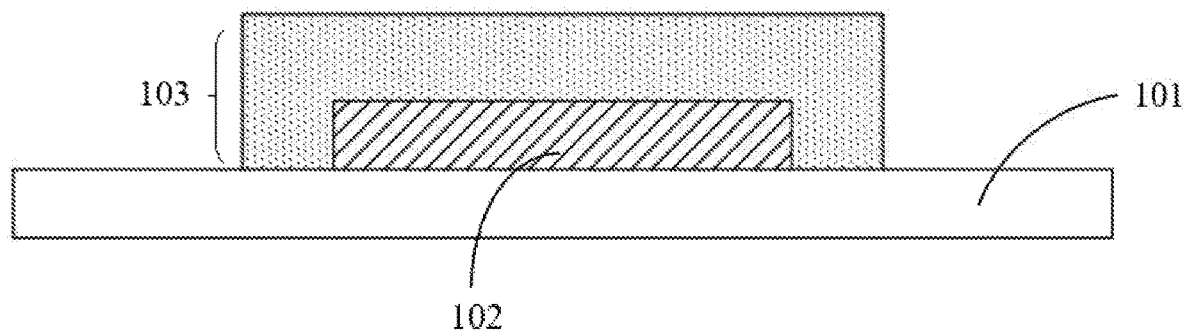

3. With reference to FIG. 2C, when one first inorganic layer 103 is formed on the OLED layer 102, the present invention can control film forming speed of the doping material by adjusting parameters of a film forming process:

The employed doping material is a high refractive index material and its doping proportion decreases at a constant speed. The employed doping material is low refractive index material, its doping proportion increases at a constant speed. The refractive index of the first inorganic layer 103 gradually decreases from bottom to top (the direction from the substrate 101 to the OLED layer 102). In an embodiment, the refractive index of an upmost one of the first inorganic layers is similar or equal to a refractive index of another thin film package layer disposed on the upmost first inorganic layer.

In an embodiment, the inorganic material of the first inorganic layer 103 can also include at least one inorganic matter configured to absorb ultraviolet (UV) wavelength band. The UV light is absorbed to protect the human eye and mitigates photoaging of OLED devices.

Step S30 comprises forming at least one first organic layer on the first inorganic layer.

Figure 2D:
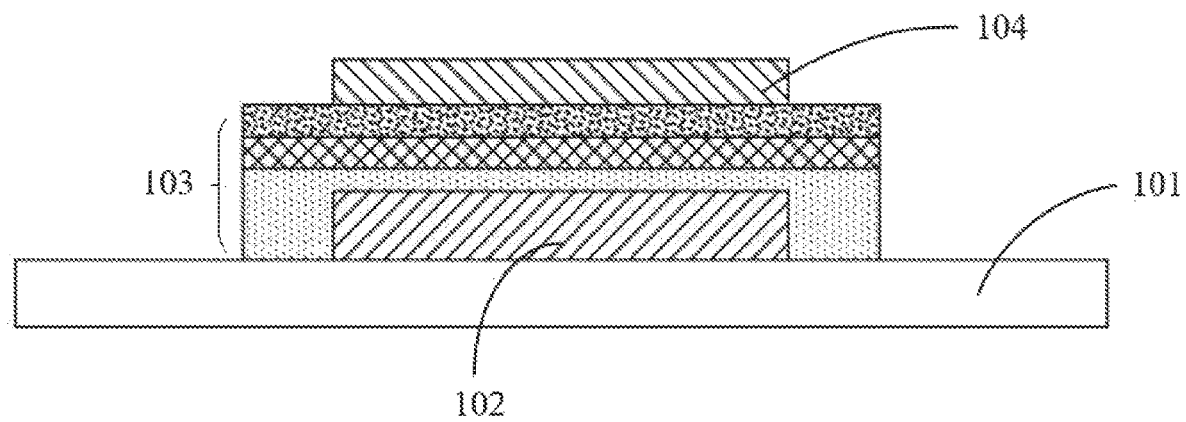

With reference to FIG. 2D, the present step can employ a non-limiting process such as a plasma-enhanced chemical vapor deposition (PECVD) method, an inkjet printing (IJP) technology or other film forming process to form at least one first organic layer 104 on the first inorganic layer 103.

A material of the first organic layer 104 includes but is not limited to acrylic, epoxy resin, HMDSO, polydimethylsiloxane, polyacrylate, polycarbonate, polystyrene, etc. A refractive index of each of the above organic materials can be 1.40-1.55.

In an embodiment, a refractive index of an organic material of the first organic layer 104 is about 1.50.

Step S40 comprises forming at least one second inorganic layer on the first organic layer.

Figure 2E:
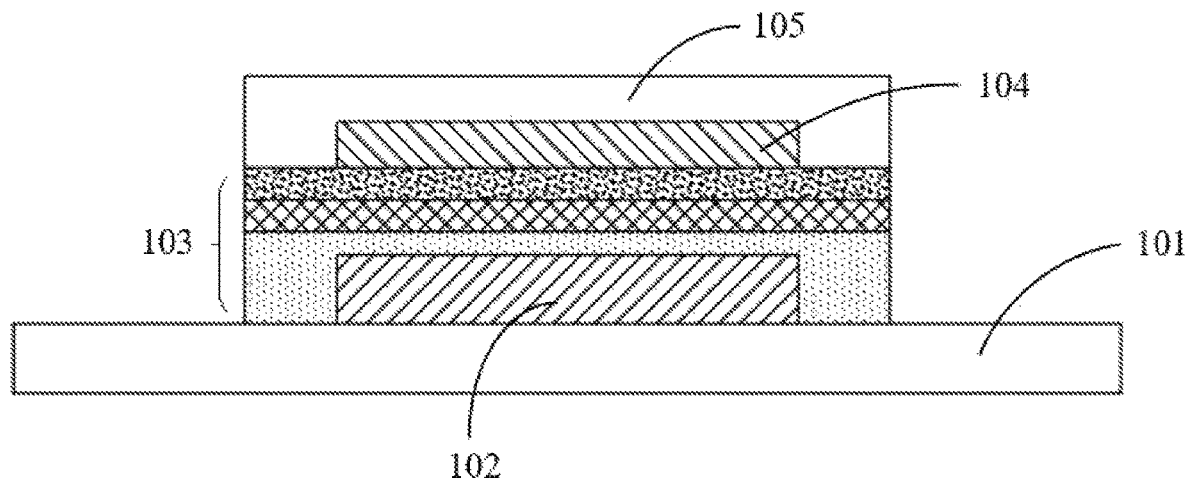

With reference to FIG. 2E, the present step can employ but is not limited to a plasma-enhanced chemical vapor deposition (PECVD) method, an inkjet printing (IJP) technology, an atomic layer deposition (ALD) or a sputtering method, etc. At least one second inorganic layer 105 is formed on the first organic layer 104. The second inorganic layer 105 covers the first organic layer 104.

A thin film thickness of the second inorganic layer 105 is 1-2 um, and is configured mainly to increase the performance of the device to block water oxygen. An inorganic material of the second inorganic layer 105 can be one of aluminum oxide, silicon nitride, silicon oxynitride or silicon dioxide. A refractive index of the above inorganic material is 1.55-1.75.

In an embodiment, the first inorganic layer, the first organic layer and the second inorganic layer in the above step are minimum periodic units of the structures of the film layers of the thin film package layer. The above three structures of the film layers can be set cyclically according to actual needs.

Figure 3:
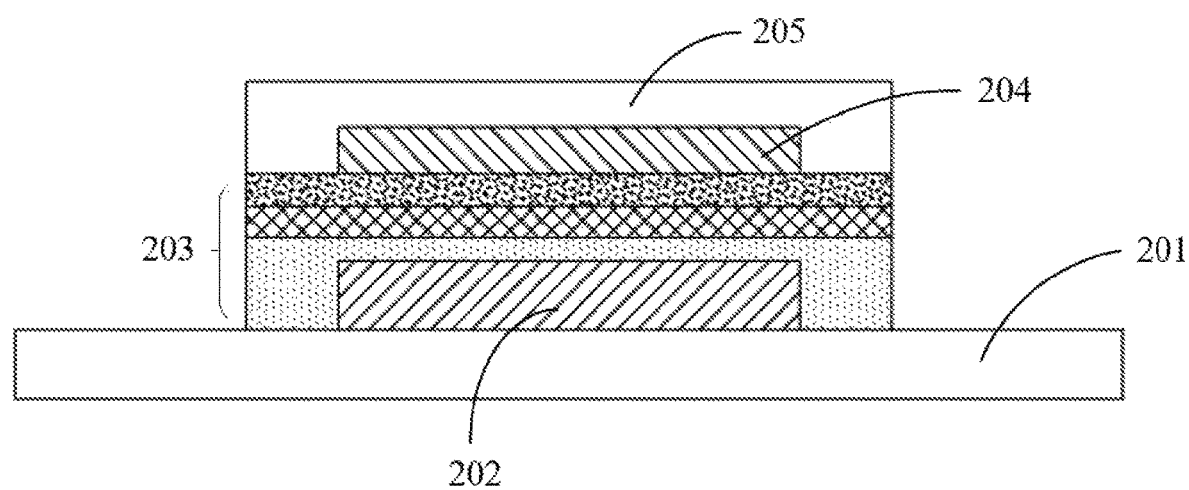
FIG. 3 is a schematic view of a structure of film layers of a first embodiment of a display panel of the present invention.

With reference to FIG. 3, FIG. 3 is a schematic view of a structure of film layers of a first embodiment of a display panel of the present invention.

The display panel includes a substrate 201, an OLED layer 202 disposed on the substrate 201, and a thin film package layer disposed on the substrate 201 and the OLED layer 202 and covering the OLED layer 202.

The thin film package layer includes at least one first inorganic layer 203, a first organic layer 204 formed on the first inorganic layer 203, and a second inorganic layer 205 formed on the first organic layer 204.

The thin film package layer is mainly configured to repel water and oxygen and prevent external water vapor from eroding the organic light-emitting layer. The thin film package layer is mainly formed by alternately stacked organic package layers and inorganic package layers.

In an embodiment, the first inorganic layer 203 can be formed on the OLED layer 202 and the substrate 201 by a film forming process such as a pulsed laser deposition (PLD) method, an atomic layer deposition (ALD) or a sputtering method.

The first inorganic layer 203 is made up of at least two composite materials with substantially different refractive indexes, proportions of the composite materials are controlled to form the first inorganic layer 203.

In an embodiment, the first inorganic layer 203 can be formed at least three ways but is not limited thereto, as follows:

1. When a first composite material is a low refractive index material, first composite material includes but is not limited to silicon dioxide or zinc oxide. A preferred range of a refractive index of the first composite material is 1.40-1.65. a proportion of the first composite material in the first inorganic layer 203 is 50-100%.

A second composite material is a high refractive index material, second composite material includes but is not limited to titanium dioxide and zirconium dioxide. In an embodiment, second composite material refractive index can be 1.80-2.40. A proportion of the second composite material in the first inorganic layer 203 is 0-50%.

Three layers of the first inorganic layer are formed on the OLED layer 202. A thickness of each film layer is 50-500 nm, and proportions of doping materials in each layer of the first inorganic layer are constants.

Along a direction from the substrate 201 to the OLED layer 202, doping proportions of the second composite materials gradually decrease. In other words, along the direction, refractive indexes of the first inorganic layers gradually decrease. A difference value between adjacent two of the first inorganic layers is 0.1-0.2. The refractive index of an upmost one of the first inorganic layers is similar or equal to a refractive index of another thin film package layer disposed on the upmost first inorganic layer to prevent total reflection due to light of the OLEDs transmitted among the film layers.

2. When the first composite material is a high refractive index material, the first composite material includes but is not limited to aluminum oxide or zirconium dioxide. In an embodiment, first composite material refractive index can be 1.75-2.25. A proportion of the first composite material in the first inorganic layer 203 is 50-100%.

A second composite material is a low refractive index material. The second composite material includes but is not limited to silicon dioxide. In an embodiment, the refractive index of the second composite material can be 1.40-1.55, and a proportion of the second composite material in the first inorganic layer 203 is 0-50%.

In the three first inorganic layers formed on the OLED layer 202, a thickness of each first inorganic layer is 50-500 nm. A proportion of the doping material in each first inorganic layer is constant.

Along the direction from the substrate 201 to the OLED layer 202, doping proportions of the second composite materials in the first inorganic layers gradually increase. In other words, along the direction from the substrate 201 to the OLED layer 202, the refractive indexes of the first inorganic layers gradually decrease. A difference value of the refractive indexes of adjacent two of the first inorganic layers is 0.1-0.2.

In an embodiment, the refractive index of an upmost one of the first inorganic layers is similar or equal to a refractive index of another thin film package layer disposed on the upmost first inorganic layer.

3. When one first inorganic layer 203 is formed on the OLED layer 202, the present invention can control film forming speed of the doping material by adjusting parameters of a film forming process:

The employed doping material is a high refractive index material and its doping proportion decreases at a constant speed. The employed doping material is low refractive index material, its doping proportion increases at a constant speed. The refractive index of the first inorganic layer 203 gradually decreases from bottom to top (the direction from the substrate 201 to the OLED layer 202). In an embodiment, the refractive index of an upmost one of the first inorganic layers is similar or equal to a refractive index of another thin film package layer disposed on the upmost first inorganic layer.

In an embodiment, the inorganic material of the first inorganic layer 203 can also include at least one inorganic matter configured to absorb ultraviolet (UV) wavelength band. The UV light is absorbed to protect human eyes and mitigates photoaging of OLED devices.

Figure 4:
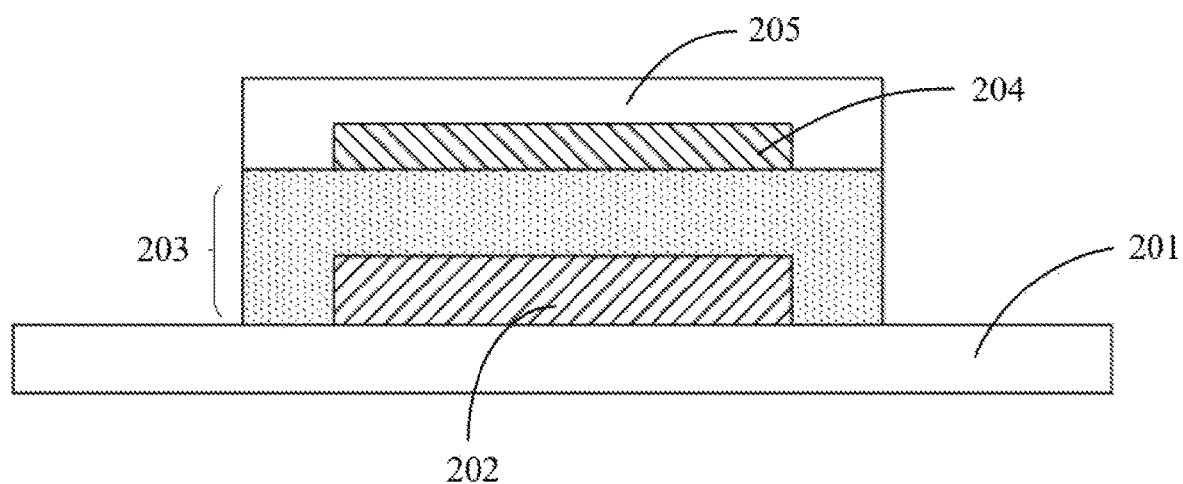
FIG. 4 is a schematic view of a structure of film layers of a second embodiment of the display panel of the present invention.

With reference to FIG. 3 or FIG. 4, the first organic layer 204 is formed on the first inorganic layer 203. The first inorganic layer 203 can employ a non-limiting process such as a plasma-enhanced chemical vapor deposition (PECVD) method, an inkjet printing (IJP) technology or other film forming process to form the first organic layer 204 on the first inorganic layer 203. The first organic layer 204 is also called organic buffer layer.

A material of the first organic layer 204 includes but is not limited to acrylic, epoxy resin, HMDSO, polydimethylsiloxane, polyacrylate, polycarbonate, polystyrene, etc. A refractive index of each of the above organic materials can be 1.40-1.55.

In an embodiment, a refractive index of an organic material in the first organic layer 204 is about 1.50.

With reference to FIG. 3 or FIG. 4, the present step can employ a non-limiting film forming process such as a plasma-enhanced chemical vapor deposition (PECVD) method, an inkjet printing (IJP) technology, an atomic layer deposition (ALD) or a sputtering method to form at least one second inorganic layer 205 on the first organic layer 204. The second inorganic layer 205 covers the first organic layer 204.

A thin film thickness of the second inorganic layer 205 is 1-2 um, and is configured mainly to increase the performance of the device to block water oxygen. An inorganic material of the second inorganic layer 105 can be one of aluminum oxide, silicon nitride, silicon oxynitride or silicon dioxide. A refractive index of the above inorganic material is 1.55-1.75.

In an embodiment, the first inorganic layer, the first organic layer and the second inorganic layer in the above steps are minimum periodic units of the structures of the film layers of the thin film package layer. The above three structures of the film layers can be set cyclically according to actual needs.

The present invention provides a display panel and a display panel manufacturing method, the display panel includes a substrate, an OLED layer, and a thin film package layer. The thin film package layer includes at least one first inorganic layer, at least one first organic layer and at least one second inorganic layer. The first inorganic layer includes an inorganic material absorbing light of an ultraviolet wavelength band to protect human eyes and mitigates photoaging of OLED devices. The refractive index of the first inorganic layer gradually decreases to prevent total reflection due to light of the OLEDs transmitted in contacting surfaces among the film layers and to effectively increase stability and light performance of the display panel.

Although the preferred embodiments of the present invention have been disclosed as above, the aforementioned preferred embodiments are not used to limit the present invention. The person of ordinary skill in the art may make various of changes and modifications without departing from the spirit and scope of the present invention. Therefore, the scope of protection of the present invention is defined by the scope of the claims.

What is claimed is:

1. A display panel manufacturing method, comprising:
providing a substrate, and forming an organic light-emitting diode (OLED) layer on the substrate;
forming a first inorganic layer covering the OLED layer with a doping material, comprising constantly varying a doping proportion of the doping material such that a refractive index of the first inorganic layer gradually decreases along a direction from the substrate to the OLED layer;
forming at least one first organic layer on the first inorganic layer; and
forming at least one second inorganic layer on the first organic layer,
wherein the second inorganic layer covers the first organic layer.

2. The manufacturing method as claimed in claim 1, wherein a minimum of the refractive index of the first inorganic layer is equal to or less than a refractive index of the first organic layer.

3. A display panel, comprising a substrate, an organic light-emitting diode (OLED) layer disposed on the substrate, and a thin film package layer disposed on the substrate and the OLED layer and covering the OLED layer;
the thin film package layer comprising a first inorganic layer, a first organic layer formed on the first inorganic layer, and a second inorganic layer formed on the first organic layer;
wherein the first inorganic layer covers the OLED layer, and the first inorganic layer is formed with a doping material, comprising constantly varying a doping proportion of the doping material such that a refractive index of the first inorganic layer gradually decreases along a direction from the substrate to the OLED layer.

4. The display panel as claimed in claim 3, wherein a minimum of the refractive index of the first inorganic layer is equal to or less than a refractive index of the first organic layer.

* * * * *